United States Patent
Kim et al.

(10) Patent No.: US 8,008,771 B2
(45) Date of Patent: Aug. 30, 2011

(54) SEMICONDUCTOR CHIP PACKAGE, ELECTRONIC DEVICE INCLUDING THE SEMICONDUCTOR CHIP PACKAGE AND METHODS OF FABRICATING THE ELECTRONIC DEVICE

(75) Inventors: Pyoung-Wan Kim, Suwon-si (KR); Eun-Chul Ahn, Gyeonggi-do (KR); Jong-Ho Lee, Gyeonggi-do (KR); Teak-Hoon Lee, Gyeonggi-do (KR); Chul-Yong Jang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 427 days.

(21) Appl. No.: 12/193,561

(22) Filed: Aug. 18, 2008

(65) Prior Publication Data
US 2009/0045513 A1 Feb. 19, 2009

(30) Foreign Application Priority Data
Aug. 17, 2007 (KR) .................. 10-2007-0082890

(51) Int. Cl.
*H01L 23/48* (2006.01)

(52) U.S. Cl. . 257/738; 257/780; 257/781; 257/E21.508; 257/E23.021

(58) Field of Classification Search .................. None
See application file for complete search history.

(56) References Cited

U.S. PATENT DOCUMENTS

| | | | |
|---|---|---|---|
| 6,972,249 B2 * | 12/2005 | Akram et al. | 438/613 |
| 2005/0082670 A1 * | 4/2005 | Quinones et al. | 257/737 |

* cited by examiner

*Primary Examiner* — Evan Pert
*Assistant Examiner* — Scott Wilson
(74) *Attorney, Agent, or Firm* — Myers Bigel Sibley & Sajovec, P.A.

(57) ABSTRACT

A semiconductor chip package including a semiconductor chip including a first surface having bonding pads, a second surface facing the first surface, and sidewalls; a molding extension part surrounding the second surface and the sidewalls of the semiconductor chip; redistribution patterns extending from the bonding pads over the molding extension part, and electrically connected to the bonding pads; bump solder balls on the redistribution patterns; and a molding layer configured to cover the first surface of the semiconductor chip and the molding extension part, while exposing portions of each of the bump solder balls. The molding layer has concave meniscus surfaces between the bump solder balls adjacent to each other.

19 Claims, 12 Drawing Sheets

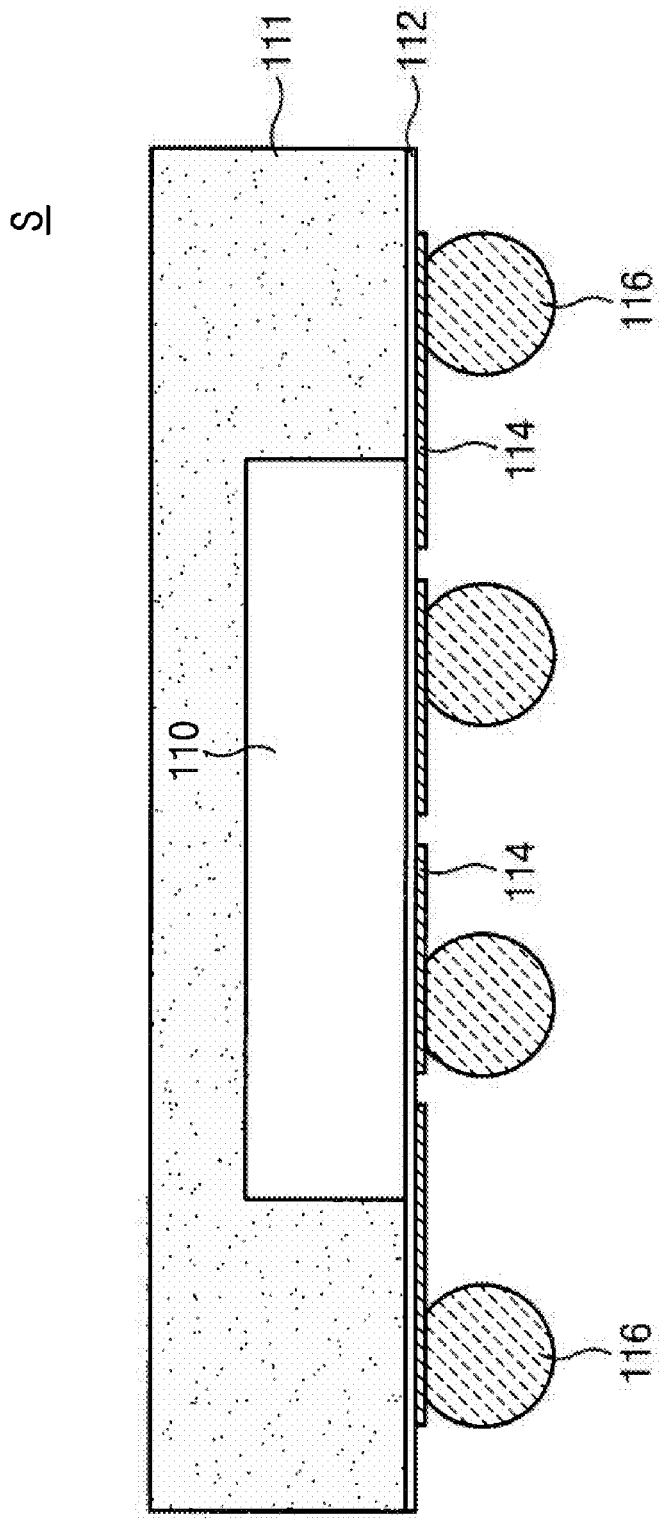

SEMICONDUCTOR CHIP PACKAGE, ELECTRONIC DEVICE INCLUDING THE SEMICONDUCTOR CHIP PACKAGE AND METHODS OF FABRICATING THE ELECTRONIC DEVICE

CROSS-REFERENCE TO RELATED APPLICATIONS

This application claims priority under 35 U.S.C. §119 to Korean Patent Application No. 10-2007-0082890 filed on Aug. 17, 2007, in the Korean Patent Office, the entire contents of which are incorporated by reference.

BACKGROUND

1. Technical Field

This disclosure is related to semiconductor packages and methods of fabricating the same and, more particularly, related to a fan-out type semiconductor package and methods of fabricating the same.

2. Description of Related Art

A major trend in development of the semiconductor field, is to reduce the size of a semiconductor device. As consumption of small-sized computer and mobile electronic device is rapidly increasing, semiconductor packages capable of providing multiple pins in a smaller size, such as a fine pitch ball grid array (FBGA) package or a chip scale package (CSP), are being developed.

Semiconductor packages such as an FBGA package or a CSP have an advantage in having smaller sizes and lighter weights. However, such packages do not provide a reliability equivalent to a conventional plastic package. In addition, the costs of raw materials used during fabrication and the processing costs are relatively high. A micro BGA (µBGA) package has better characteristics compared to the FBGA package or the CSP; however this package is also less reliable and less competitive in cost.

To overcome these shortcomings, a wafer level CSP (WL-CSP) has been developed, which uses redistribution of bonding pads of semiconductor chips on wafer. In a WL-CSP using redistribution, bonding pads on the semiconductor substrate are directly redistributed to larger pads. External connection terminals such as solder balls are disposed on the larger pads.

In such WL-CSP, the size of solder balls are scaled down as the size of semiconductor chips become smaller. As the size of the solder balls decreases, a solder ball layout having finer pitch is required. However, compared to the downsizing of the semiconductor chips by the continuously decreasing design rule, there is limit to an art of making finer solder ball layouts.

SUMMARY

An embodiment includes a semiconductor chip package including a semiconductor chip including a first surface having bonding pads, a second surface facing the first surface, and sidewalls; a molding extension part surrounding the second surface and the sidewalls of the semiconductor chip; redistribution patterns extending from the bonding pads over the molding extension part, and electrically connected to the bonding pads; bump solder balls on the redistribution patterns; and a molding layer configured to cover the first surface of the semiconductor chip and the molding extension part, while exposing portions of each of the bump solder balls. The molding layer has concave meniscus surfaces between the bump solder balls adjacent to each other.

Another embodiment includes a method of fabricating a semiconductor chip package including preparing a semiconductor chip having a first surface including bonding pads, a second surface facing the first surface, and sidewalls; forming a molding extension part surrounding the second surface and the sidewalls of the semiconductor chip; forming redistribution patterns to be extended to the molding extension part, and to be electrically connected to the bonding pads; forming bump solder balls on the redistribution patterns; and forming a molding layer to cover the first surface and expose portions of each of the bump solder balls such that the molding layer has concave meniscus surfaces between the bump solder balls adjacent to each other.

BRIEF DESCRIPTION OF THE DRAWINGS

The accompanying drawings are included to provide a further understanding of the embodiments, and are incorporated in and constitute a part of this specification. The drawings, together with the description, serve to explain principles of the embodiments. In the drawings:

FIGS. 4A to 4D are cross-sectional views illustrating a method of fabricating an example of a semiconductor chip package according to an embodiment;

DETAILED DESCRIPTION OF THE EMBODIMENTS

Figure 1:
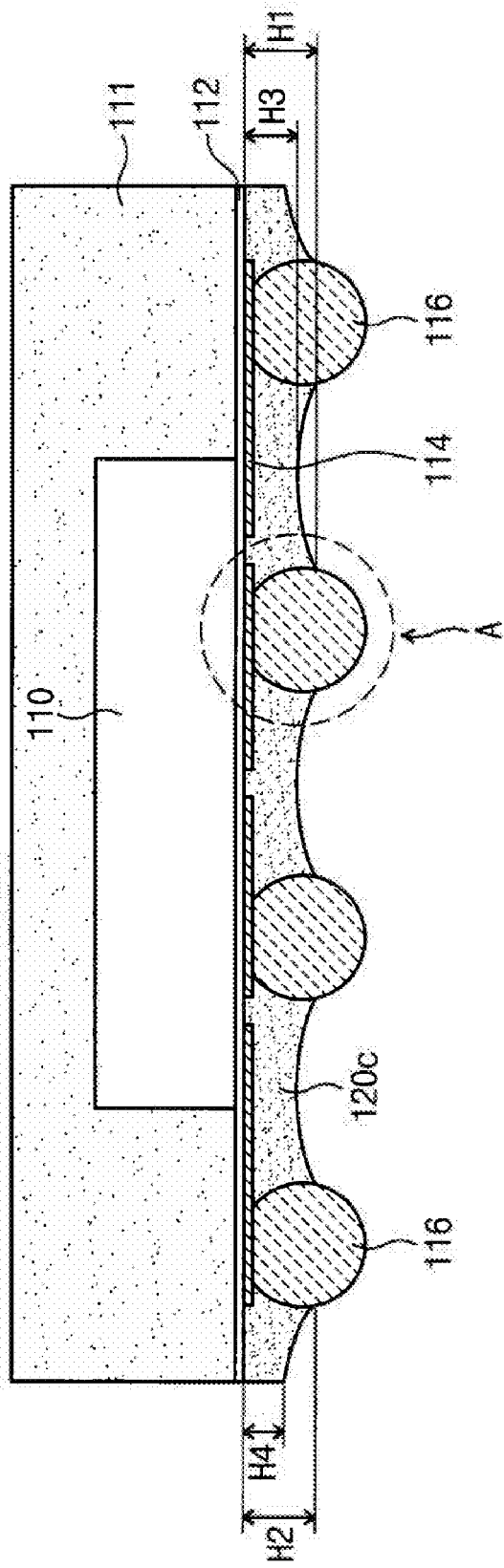
FIG. 1 is a cross-sectional view illustrating an example of a semiconductor chip package according to an embodiment.

Embodiments will now be described more fully hereinafter with reference to the accompanying drawings. Embodiments may take many different forms and should not be construed as limited to the embodiments set forth herein. Rather, these embodiments are provided so that this disclosure will be thorough and complete, and will fully convey the scope of the following claims to those skilled in the art. Any element in a claim that does not explicitly state "means for" performing a specified function, or "step for" performing a specific function, is not to be interpreted as a "means" or "step" clause as specified in 35 U.S.C. §112, paragraph 6. In particular, the use of "step of" in the claim herein is not intended to invoke the provisions of 35 U.S.C. §112, paragraph 6. In the drawings, the thicknesses of layers and regions are exaggerated for clarity. It will also be understood that when a layer is referred to as being "on" another layer or substrate, it can be directly on the other layer or substrate, or intervening layers may also be present. Like reference numbers refer to like elements throughout.

Figure 2:
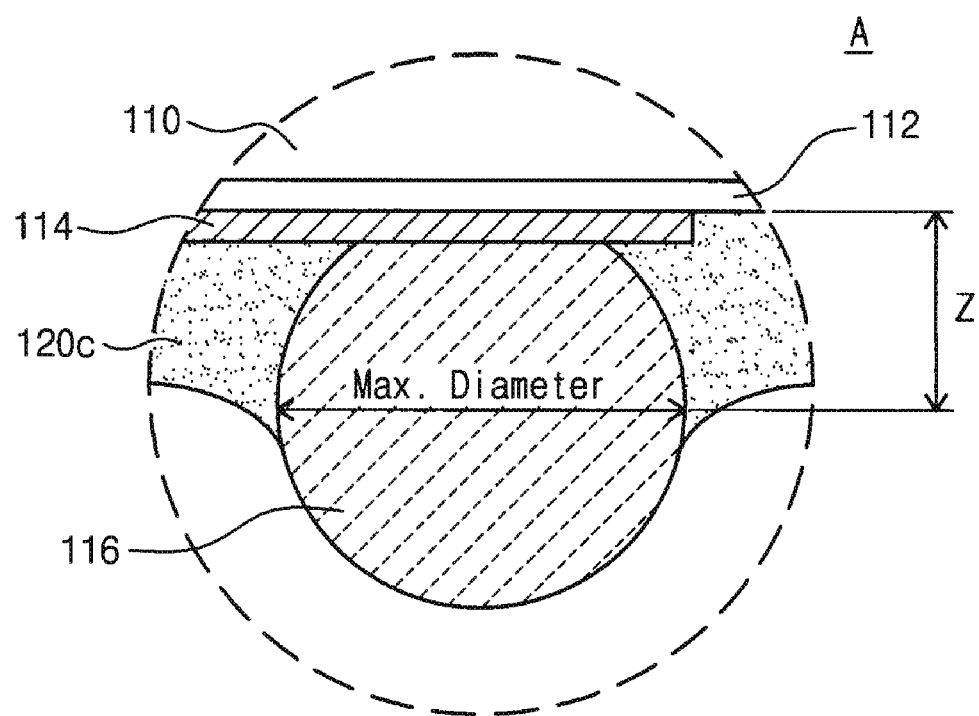
FIG. 2 is an enlarged cross-sectional view of portion A of FIG. 1.

FIG. 1 is a cross-sectional view illustrating an example of a semiconductor chip package according to an embodiment. FIG. 2 is an enlarged cross-sectional view of portion A of FIG. 1. Referring to FIG. 1 and FIG. 2, a semiconductor chip package may include a semiconductor chip 110, a molding extension part 111, redistribution patterns 114, bump solder balls 116, and a molding layer 120c.

The semiconductor chip 110 may include an active surface having bonding pads (not shown), a rear surface opposite the active surface, and sidewalls. The semiconductor chip may be any variety of a semiconductor chip, such as a memory chip, a logic chip, etc. The semiconductor chip 110 may have a thickness between about 50 and about 760 μm. More desirably, the semiconductor chip 110 may have a thickness between about 50 and about 200 μm. The semiconductor chip package may be made thinner by decreasing the thickness of the semiconductor chip 110.

The molding extension part 111 may surround the rear surface and the sidewalls of the semiconductor chip 110. The molding extension part 111 may be made of a resin-based material, an epoxy molding compound (EMC), the same material as the molding layer 120c, or the like. Accordingly, the rear surface and the sidewalls of the semiconductor chip 110 may be protected from chemical/physical influence from external environment, by the molding extension part 111.

The redistribution patterns 114 may extend from the bonding pads to the molding extension part 111, while being electrically connected to the bonding pads of the semiconductor chip 110. An insulation layer 112 may be further interposed between the redistribution patterns 114 and the active surface of the semiconductor chip 110. The insulation layer 112 may be for providing electrical insulation between the redistribution patterns 114 and the semiconductor chip 110. The insulation layer 112 may only be disposed between the active surface of the semiconductor chip 110 and the redistribution patterns 114. Alternatively, the insulation layer 112 may be further interposed between the redistribution patterns 114 and the molding extension part 111.

The bump solder balls 116 may be provided on the redistribution patterns 114. The bump solder balls 116 may include solder material with a Young's modulus of about 20 to about 90 GPa. The bump solder balls 116 may provide electrical connection between the semiconductor chip 110 and an external circuit (e.g., wiring substrate, printed circuit board, or the like).

The semiconductor chip package may have a fan-out package structure by including the above semiconductor chip 110, the molding extension part 111, the redistribution patterns 114 and the bump solder balls 116. Thus even though the size of the semiconductor chip 110 becomes smaller, the preexisting solder ball layout may be maintained, therefore, the solder joint reliability (SJR) of the bump solder balls 116 may be prevented from being lowered, during the process of mounting the semiconductor chip package on the wiring substrate.

The molding layer 120c may cover the active surface of the semiconductor chip 110 and the molding extension part 111 while exposing portions of each bump solder balls 116. The molding layer 120c between the bump solder balls 116 disposed adjacent to each other may have concave meniscus surfaces which have edges that contact the bump solder balls 116. The bump solder balls 116 may include a cross-section parallel to the active surface of the semiconductor chip 110 having a maximum diameter. A height H1 is a length between the active surface of the semiconductor chip 110 and/or the surface of the molding extension part 111 to the edge in contact with the bump solder balls 116 on the concave meniscus surfaces. The height H1 may be within a length of about ⅐ of the maximum diameter of the bump solder ball 116 towards the upper portion or the lower portion of the semiconductor chip package from a height Z. The height Z is a length from the active surface of the semiconductor chip 110 and/or the surface of the molding extension part 111 to the cross-section of the bump solder balls 116. For example, if the maximum diameter of the bump solder ball 116 is 350 μm, the height H1 at the edge of the concave meniscus surfaces may be within ±50 μm from the height Z at the cross-section of the bump solder balls 116. Accordingly, the active surface of the semiconductor chip 110 may be protected from chemical/physical influence of external environment by the molding layer 120c.

As the adhesive characteristics of the bump solder balls 116 may be enhanced by the molding layer 120c, the thermal stress concentrated at the contacting portions with the bump solder balls 116 of the semiconductor chip package may be dispersed. Thus, the solder joint reliability (SJR) of the bump solder balls 116 may be enhanced. Also, the molding layer 120c may decrease the difference in thermal expansion coefficient between the semiconductor chip 110 and a wiring substrate. During a process mounting the semiconductor chip package on the wiring substrate, the SJR of the bump solder balls 116 may be enhanced.

The concave meniscus surfaces of the molding layer 120c may include the first height H1, a second height H2, a third height H3, and a fourth height H4. The first height H1 may be a length from the active surface of the semiconductor chip 110 and/or the surface of the molding extension part 111 to the edge in contact with the bump solder balls 116. The second height H2 may be a length from the active surface of the semiconductor chip 110 and/or the surface of the molding extension part 111 to the portion in contact with the outermost bump solder ball among the bump solder balls 116. The third height H3 may be a length from the active surface of the semiconductor chip 110 and/or the surface of the molding extension part 111 to the lowermost portion between the bump solder balls 116. And the fourth height H4 may be a length from the active surface of the semiconductor chip 110 and/or the surface of the molding extension part 111 to the edge of the semiconductor chip 110. There may be a difference within about ⅕ of maximum diameter of the bump solder balls 116 between the first height H1 and the third height H3. For example, when the maximum diameter of the bump solder ball 116 is 350 μm, there may be a maximum height difference of 70 μm and minimum 10 μm between the first height H1 and the third height H3. The second height H2 may be longer or shorter than the first height H1, and the fourth height H4 may be longer or shorter than the third height H3. Also, there may be at least 10 μm of difference in height between the second height H2 and the fourth height H4.

The molding layer 120c may have the height H1, which has the height within ⅐ length of the maximum diameter of the bump solder balls 116 from the height Z at the cross-section of maximum diameter of the bump solder balls 116 to the active surface of the semiconductor chip 110 and/or the surface of the molding extension part 111. Therefore, the adhesion characteristics of the bump solder balls 116 may be enhanced. As the thermal stress concentrated on the bump solder balls 116 of the semiconductor chip package and the joint portion, the SJR may be enhanced.

When the height H1, which is a height to the edge in contact with the bump solder balls 116 of the concave meniscus surfaces, is more than about ⅐ of the maximum diameter of the bump solder balls 116 towards the upper potion from the height Z, defects such as a void may occur during a process of forming the molding layer 120c. In addition, the electrical reliability may be lowered as the surface of the bump solder balls 116 is not exposed sufficiently, the bump solder balls 116 which provide electrical connection between the semiconductor chip 110 and an external circuit.

On the other hand, when the height H1 is more than about ⅐ of the maximum diameter of the bump solder balls 116 towards the lower potion from the height Z, the adhesion characteristics of the bump solder balls 116 disposed on the redistribution patterns 114 may also be decreased. Accordingly, the SJR of the bump solder balls 116 may also be decreased, during the process mounting the semiconductor chip package on the wiring substrate.

The concave meniscus surfaces of the molding layer 120c may have a matte or non-matte finish. With a matte finish, the concave meniscus surfaces of the molding layer 120c can have low reflection characteristics due to the rough surface. Accordingly, the surface of the bump solder balls 116 and the surface of the molding layer 120c may be easily recognized with naked eye, during inspection of the semiconductor chip package.

The molding layer 120c may include an epoxy molding compound (EMC). The EMC may contain from about 50 to about 90 percentage by weight of silica ($SiO_2$). The EMC may have a thermal expansion coefficient below about 50 ppm/° C., in a temperature range of under a glass transition temperature (Tg). The EMC may have an elastic modulus of about 3 GPA or higher.

The semiconductor chip package having the above structure can include a molding layer which exposes a portion of each bump solder balls, while covering an active surface of a semiconductor chip and a molding extension part, thereby the active surface of the semiconductor chip may be protected from chemical/physical influences of an external environment. Also, the SJR may be enhanced as the molding layer decreases the difference in thermal expansion coefficient between the semiconductor chip and a wiring substrate during the process of mounting the semiconductor chip package. In addition, by the structure of the molding extension part which surrounds a rear surface and sidewalls of the semiconductor chip, the rear surface and the sidewalls of the semiconductor chip may be protected from chemical/physical influence of external environment.

Figure 3:
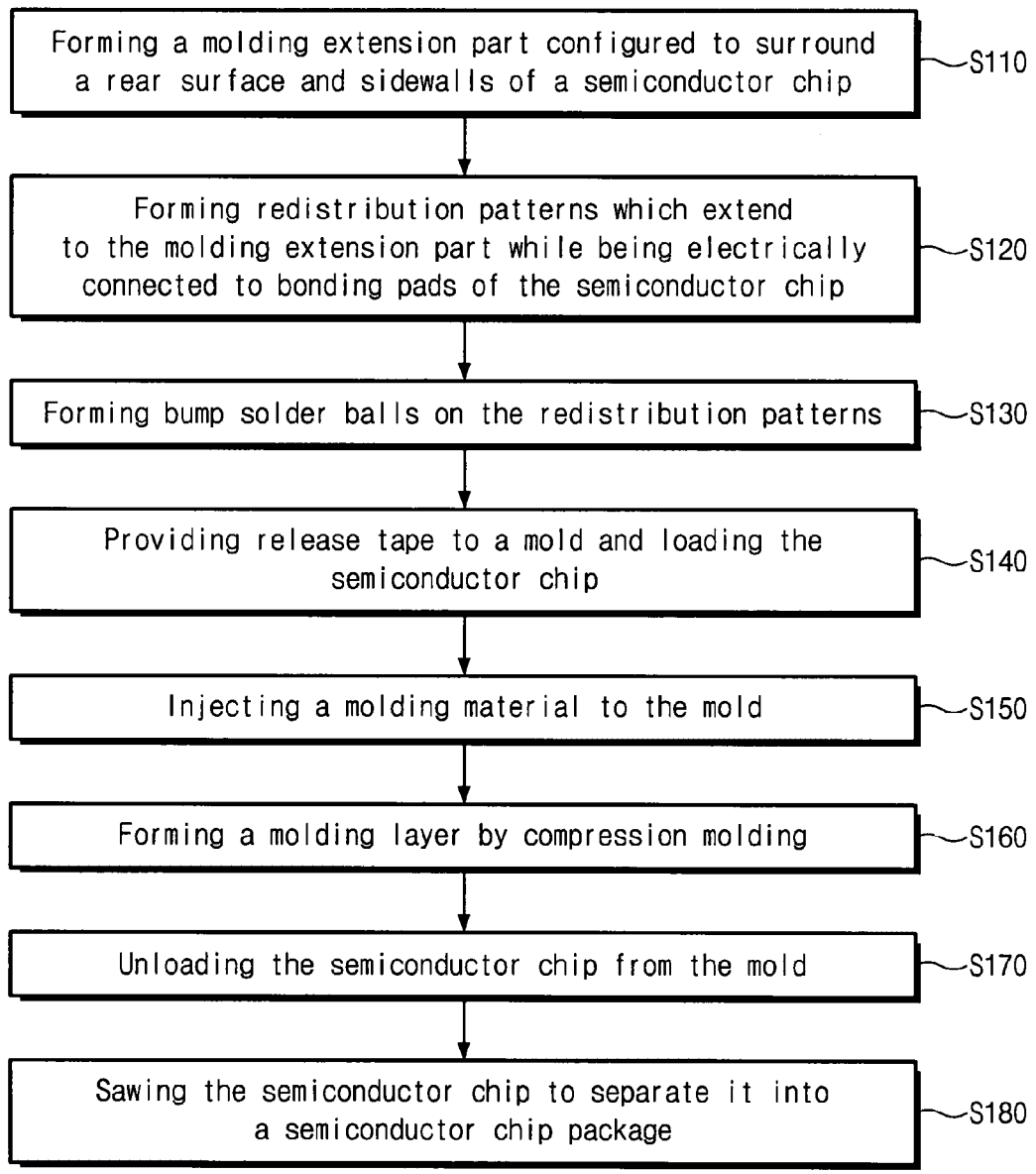
FIG. 3 is a flow chart illustrating a method of fabricating an example of a semiconductor chip package according to an embodiment.

FIG. 3 is a flow chart of a process illustrating a method of fabricating a semiconductor chip package according to an embodiment. Referring to FIG. 3, the method of fabricating a semiconductor chip package includes: forming a molding extension part configured to surround a rear surface and sidewalls of a semiconductor chip in S110; forming redistribution patterns which extend to the molding extension part while being electrically connected to bonding pads of the semiconductor chip in S120; forming bump solder balls on the redistribution patterns in S130; providing release tape to a mold and loading the semiconductor chip in S140; injecting a molding material to the mold in S150; forming a molding layer on the active surface of the semiconductor chips and the molding extension part by compression molding in S160; unloading the semiconductor chip from the mold in S170; and sawing the semiconductor chip to separate it into a semiconductor chip package in S180.

The above is a brief description of the method of fabricating the semiconductor chip package. A more detailed description will be disclosed with reference to FIGS. 4A to 4D, FIGS. 5A to 5C, and FIGS. 7A to 7C. Moreover, although one semiconductor chip has been referenced above as being formed into a semiconductor package, multiple semiconductor chips can be substantially simultaneously packaged into individual semiconductor packages.

Figure 4A:
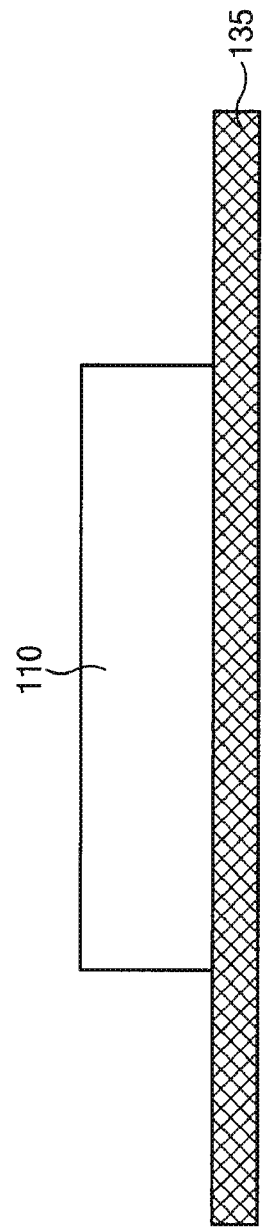

FIGS. 4A to 4D are cross-sectional views illustrating a method of fabricating a semiconductor chip package according to an embodiment. Referring to FIG. 4A, at least one semiconductor chip 110 may be bonded to a carrier 135. When bonding more than one semiconductor chips 110, each semiconductor chip 110 may be disposed on the carrier 135 so that they may be spaced according to the size of the package to be fabricated. An adhesive material layer may be used to bond the semiconductor chip 110 to the carrier 135. Bonding the semiconductor chip 110 to the carrier 135 may lead an active surface of the semiconductor chip 110 to be in contact with the carrier 135. Accordingly, a rear surface and sidewalls of the semiconductor chip 110 may be exposed.

Before bonding the semiconductor chip 110 to the carrier 135, the method of fabricating the semiconductor chip package may further include polishing the rear surface of the semiconductor chip 110 and sawing a plurality of semiconductor chips disposed on a semiconductor wafer into each semiconductor chip 110. The semiconductor chip 110 with a polished rear surface may have a thickness between a range of about 50 to about 760 µm. Preferably, the semiconductor chip 110 of which the rear surface is polished may have a thickness between a range of about 50 to about 200 µm. The semiconductor chip package may be made thinner in size by providing the semiconductor chip 110 having a smaller thickness.

The carrier 135 may be made of one selected from a metal, a ceramic, an organic material, or the like. The carrier 135 may be used to ease and/or decrease the physical stress loaded on the semiconductor chip 110 in a sequential process of forming a molding extension part which surrounds the rear surface and the sidewalls of the semiconductor chip 110. The adhesive material layer may be a reworkable adhesive. The reworkable adhesive may be used to make the process of removing the semiconductor chip 110 easier after the molding extension part is formed. An adhesive tape including ultraviolet curable resin (UV resin) or thermoplastic resin may be used for the adhesive material layer.

Figure 4B:
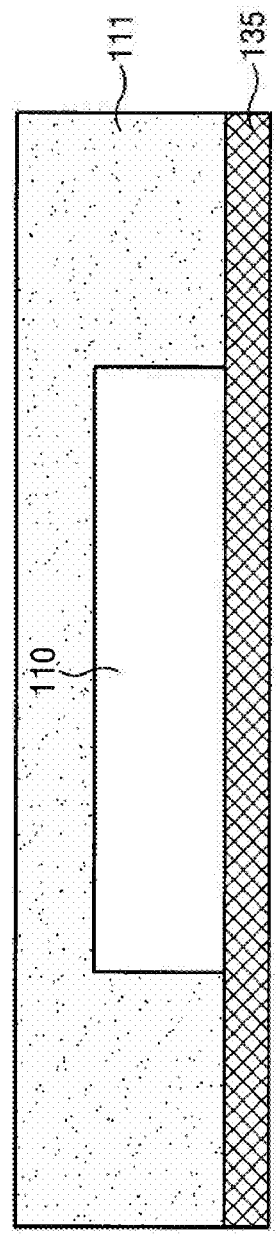

Referring to FIG. 4B, a molding extension part 111 can be formed surrounding the rear surface and the sidewalls of the semiconductor chip 110. The molding extension part 111 may be used to protect the rear surface and the sidewalls of the semiconductor chip 110 from chemical/physical influence of external environment. Forming the molding extension part 111 may be done by a variety of methods including printing, transfer molding, compression molding, or the like. The molding extension part 111 may be made of a resin-based material or an epoxy molding compound. Also, the molding extension part 111 may be made of the same material with a molding layer formed subsequently.

Figure 4C:
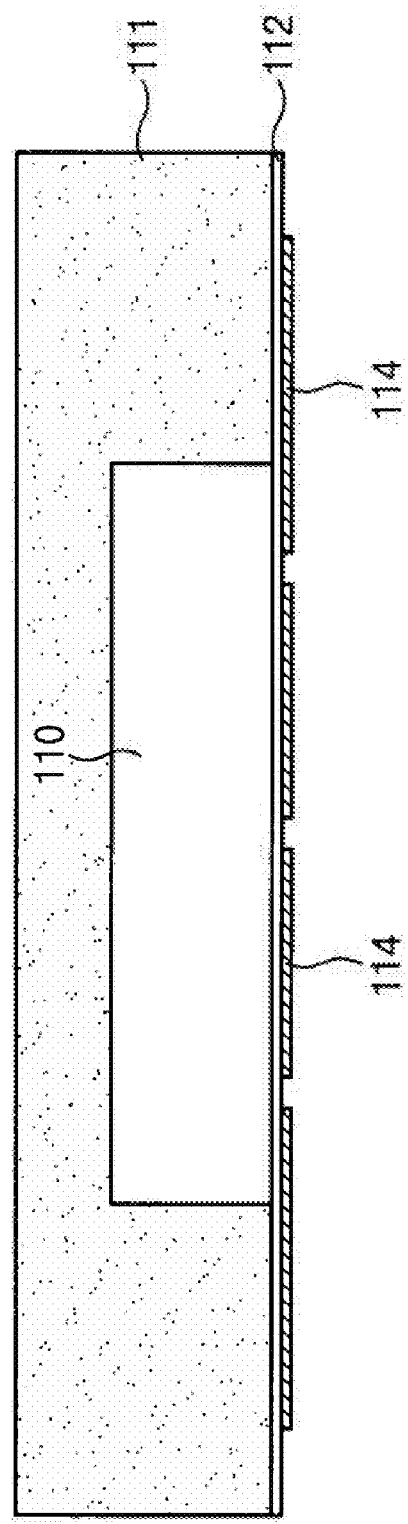

Referring to FIG. 4C, after the carrier 135 covering the active surface of the semiconductor chip 110 is removed, an insulation layer 112 may be formed on the active surface of semiconductor chip 110 and the molding extension part 111. The insulation layer 112 may be used to electrically insulate between the semiconductor chip 110 and redistribution patterns 114. The insulation layer 112 may include a land region (not shown) configured to expose a plurality of bonding pads (not shown) of the semiconductor chip 110, in order to allow electrical connections between the semiconductor chip 110 and the redistribution patterns 114.

The redistribution patterns 114 may extend on the molding extension part 111, while being electrically connected to the bonding pads of the semiconductor chip 110. A general redistribution method may be used including plating or lamination to form the redistribution patterns 114. Description on the redistribution method will be omitted for brevity.

Referring to FIG. 4D, bump solder balls 116 may be formed on the redistribution patterns 114. Methods of forming the bump solder balls 116 may include solder ball attachment, solder printing, solder jetting, or the like.

When the above processes are performed on a group of semiconductor chips S which include multiple semiconductor chips 110, a sawing process to separate into individual semiconductor chips 110 may be further included after the bump solder balls 116 are formed. Alternatively, after forming the molding layer described below, a sawing process for separating the semiconductor chips 110 into individual semiconductor chip packages may be performed.

In an embodiment, the semiconductor chip package may have a fan-out package structure by being structured to include the semiconductor chip 110, the molding extension part 111, the redistribution patterns 114 and the bump solder balls 116. Accordingly, even when the size of the semiconductor chip 110 is made smaller, the preexisting solder ball layout may be maintained, thereby being able to prevent the solder joint reliability (SJR) of the bump solder balls 116 from decreasing during the process of mounting the semiconductor chip package on the interconnection substrate.

Figure 5A:
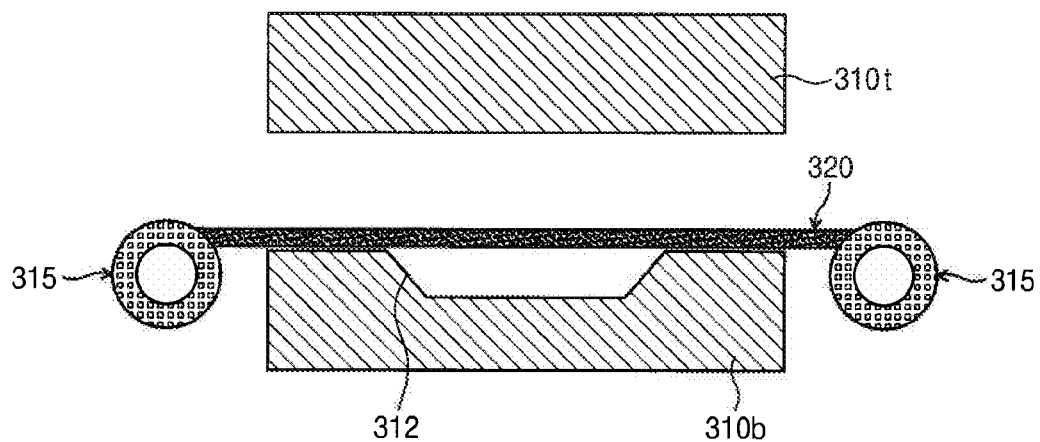
FIGS. 5A to 5C are cross-sectional views illustrating a method of fabricating an example of a semiconductor chip package according to an embodiment.
Figure 5B:
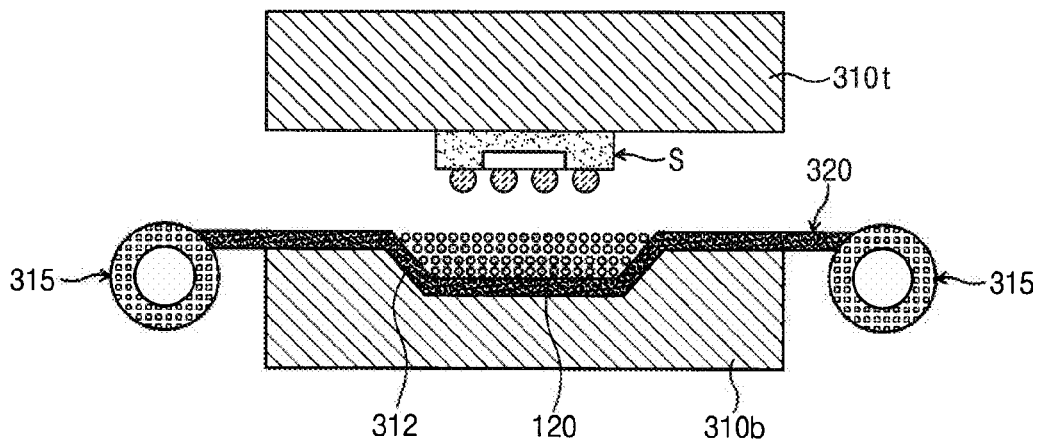
Figure 5C:
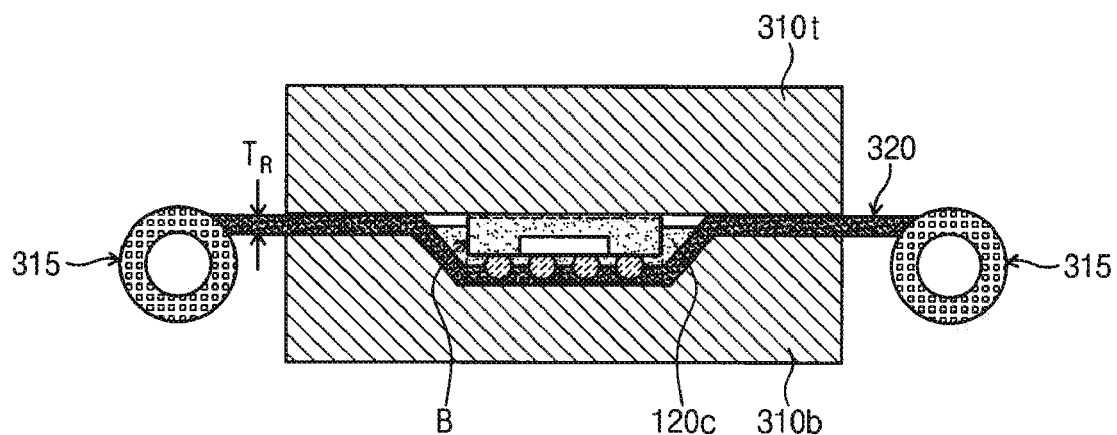
Figure 6:
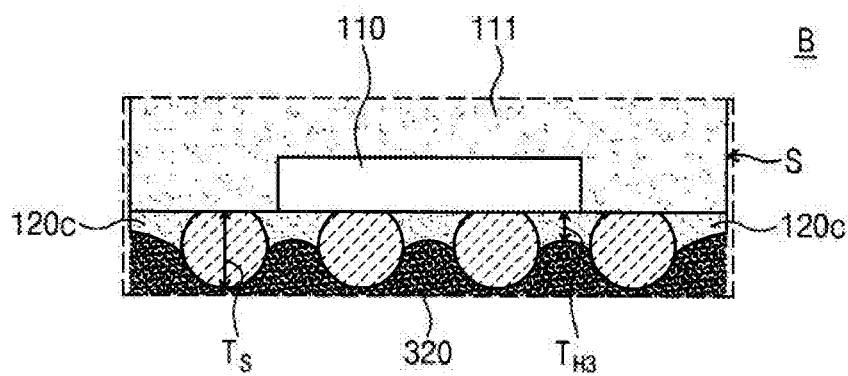
FIG. 6 is an enlarged cross-sectional view of portion B of FIG. 5C.

FIGS. 5A to 5C are cross-sectional views illustrating an example of a method of fabricating a semiconductor chip package according to an embodiment. FIG. 6 is an enlarged cross-sectional view of portion B of FIG. 5C. Referring to FIG. 5A, a mold may include a lower mold 310b and an upper mold 310t. The lower mold 310b may have a molding portion 312. In this example, the molding portion 312 is the concave part of the lower mold 310b. The upper mold 310t may have a mounting part. The mold may be configured to heat to over a temperature of 175° C. to liquefy the molding material (See 120 of FIG. 5B).

A release tape 320 may be provided between the lower mold 310b and the upper mold 310t. The release tape 320 may be supplied to the lower mold 310b through tape rollers 315 fixed on both sides of the lower mold 310b. The release tape 320 may be made of a durable material that is not deformed in the temperature in which molding process is performed. The release tape 320 may include polytetrafluoroethylene (PTFE), ethylene/tetrafluoroethylene (ETFE), or the like.

Referring to FIG. 5B, a group of semiconductor chips S in which bump solder balls are mounted may be loaded on the mounting part 314 of the upper mold 310t. The group of semiconductor chips S may include at least one semiconductor chip. As described with reference to FIG. 4D, the group of semiconductor chips S may be separated into individual semiconductor chips. The group of semiconductor chips S may be mounted on a carrier which has chip sawing scribe lanes between the semiconductor chips. Alternatively, the group of semiconductor chips S may be not separated into individual semiconductor chips. In this case, the group of semiconductor chips S may not include the carrier. The group of semiconductor chips S may be loaded so that a rear surface of the semiconductor chips S face the mounting part 314 of the upper mold 310t.

The group of semiconductor chips S may be loaded on the mounting part 314 of the upper mold 310t using an adhesive material layer. A reworkable adhesive which can be easily separated after adhesion may be used for the adhesive material layer. This is because the group of semiconductor chips S may be unloaded after the molding process is completed. An adhesive tape including ultraviolet curable resin (UV resin), thermoplastic resin, or the like may be used for the adhesive material layer.

After the release tape 320 is sealed to the molding part 312 of the lower mold 310b, a molding material 120 may be injected into the molding part 312 which includes the sealed release tape 320. The molding material 120 may include, for example, an epoxy molding compound (EMC). The EMC may be in powder or liquid, and may include silica in range of about 50 to 90% by weight. The EMC may have a thermal expansion coefficient below about 50 ppm/° C. in a temperature range below the glass transition temperature (Tg). Accordingly, the bump solder balls of the group of semiconductor chips S which are loaded on the mounting part of the upper mold 310t may be disposed over the molding material 120.

After the molding material 120 is injected, the processes may further include preheating the molding part of the lower mold 310b and vacuum exhausting. The preheating may be done to liquefy the molding material 120, for example, if the molding material 120 is in powder state. The preheating may be performed for more than about two seconds in a temperature of about 175° C. The vacuum exhausting may be done to prevent a non-uniform or incomplete molding layer from being formed which may be generated during forming the molding layer (See 120c of FIG. 5C). The vacuum exhausting may be performed so that the inner pressure of the molding part of lower mold 310b is under about 50 torr.

Referring to FIG. 5C and FIG. 6, a molding layer 120c covering the active surface of the semiconductor chip and a molding extension part may be formed by compression molding. The compression molding may include compressing the group of semiconductor chips S into the liquefied molding material 120 and the release tape 320. The compressing may include sealing in close contact the upper mold 301t and the lower mold 310b. In an embodiment, the compressing may include moving the upper mold 310t and/or the lower mold 310b to be in contact with each other with the release tape 320 in between. After the molding layer 120c is formed, by performing an additional curing process, for example, a curing process exposing the molding layer 120c to a temperature of over 100° C., the adhesion between the molding layer 120c, the active surface of the semiconductor chip and the molding extension part may be enhanced, and at the same time stability of the molding layer 120c may be increased.

The molding layer 120c may be formed by compression molding, the molding layer 120c exposing portions of each bump solder balls while covering the active surface of the semiconductor chip and the molding extension part. The molding layer 120c may have concave meniscus surfaces which have edges that contact the bump solder balls, between the bump solder balls disposed adjacent to each other. The bump solder balls may include cross-section having a maximum diameter and be parallel to the active surface of the semiconductor chip. A height H1 (see H1 of FIG. 1) may be within a length of $1/7$ of the maximum diameter of the bump solder ball from the cross-sections of the bump solder balls towards or away from the active surface of the semiconductor chip and/or the surface of the molding extension part. Accordingly, the active surface of the semiconductor chip may be protected from chemical/physical influence of external environment by means of the molding layer 120c.

As the adhesion characteristics of the bump solder balls can be enhanced by the molding layer 120c, the thermal stress concentrated on the contact portion and the bump solder balls of the semiconductor chip packages may be dispersed. Accordingly, the SJR of the bump solder balls may be enhanced. Also, the molding layer 120c may decrease the difference in thermal expansion coefficient between the semiconductor chip and a wiring substrate. Thus the SJR of the bump solder balls may be enhanced in a process of mounting the semiconductor chip package on the wiring substrate.

As the molding layer 120c improves the strength of the group of semiconductor chips S, the molding layer 120c may minimize chipping (breaking of edges of the semiconductor chip package) from occurring during a subsequent sawing process of separating into individual semiconductor chip packages. Therefore, quality deterioration of the semiconductor chip package due to sawing process may be prevented or reduced.

The concave meniscus surfaces of the molding layer 120c may result from the release tape 320 interposed between the upper mold 310t and the lower mold 310b. This may be because portions of the bump solder balls compress the release tape 320 during the compression molding process. Accordingly, the release tape 320 may form convex meniscus surfaces between the bump solder balls lying adjacent to each other. As a result, the molding layer 120c may have concave meniscus surfaces by the convex meniscus surfaces of the release tape 320.

The thickness $T_R$ of the release tape 320 may be larger than a difference in length between a third height $T_{H3}$ (corresponding to H3 of FIG. 1) of the molding layer 120c and a height of the bump solder ball $T_S$. The release tape 320 may have an elongation rate between about 10 to about 900% and a tensile stress below about 50 MPa. If the tensile stress of the release tape 320 is over about 50 MPa, the bump solder balls including solder material may become deformed when they are pressed by the release tape 320. The concave meniscus surfaces may include the first height, a second height H2, a third height H3, and a fourth height H4 as referred to in FIG. 1. Accordingly, the adhesion characteristics of the bump solder balls may be enhanced as described above. As the thermal stress concentrated on the contact portion and the bump solder balls of the semiconductor chip package, the SJR may be enhanced as described above.

When the first height to the edge in contact with the bump solder balls of the concave meniscus surfaces, is further than about 1/7 of the maximum diameter of the bump solder balls towards the upper potion from the level of the cross-section of maximum diameter of the bump solder ball, defects such as a void may occur during a process of forming the molding layer 120c. In addition, the electrical reliability may be lowered as the surface of the bump solder balls is not exposed sufficiently, the bump solder balls of which provide electrical connection between the semiconductor chip and an external circuit.

On the other hand, when the first height to the edge in contact with the bump solder balls of the concave meniscus surfaces, is further than about 1/7 of the maximum diameter of the bump solder balls towards the lower potion from the level of cross-section of maximum diameter of the bump solder ball, the adhesion characteristics of the bump solder balls disposed on the redistribution patterns may be decreased. Accordingly, the SJR of the bump solder balls may also be decreased, during the process mounting the semiconductor chip package on the wiring substrate.

The release tape 320 may have a matte or non-matte finish. The surface of the release tape 320 may be deformed into the concave meniscus surfaces of the molding layer 120c in the molding process. Therefore, the concave meniscus surfaces of the molding layer 120c may have a matte or non-matte finish. The concave meniscus surfaces of the molding layer 120c according to an embodiment may have a matte finish. As the concave meniscus surfaces of the molding layer 120c may have low reflection characteristics due to the rough surface, the surface of the bump solder balls and the surface of the molding layer 120c may be easily recognized with the naked eye, during inspection of the semiconductor chip package.

Although not shown, after the group of semiconductor chips S in which the molding layer 120c is formed is unloaded with the upper mold, the process may further include sawing the chip sawing scribe lane and the molding layer 120c between the multiple semiconductor chips, and separating them into individual semiconductor chip packages. Therefore, a semiconductor chip package including the molding layer 120c may be fabricated with the molding layer 120c having concave meniscus surfaces exposing portions of each bump solder balls while covering the active surface of the semiconductor chip and the molding extension part.

Figure 7A:
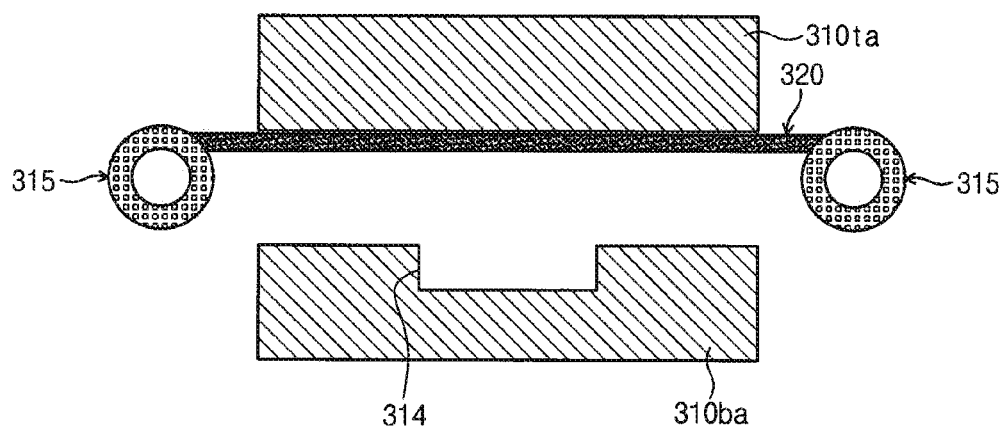
FIGS. 7A to 7C are cross-sectional views illustrating another method of fabricating an example of a semiconductor chip package according to an embodiment.
Figure 7B:
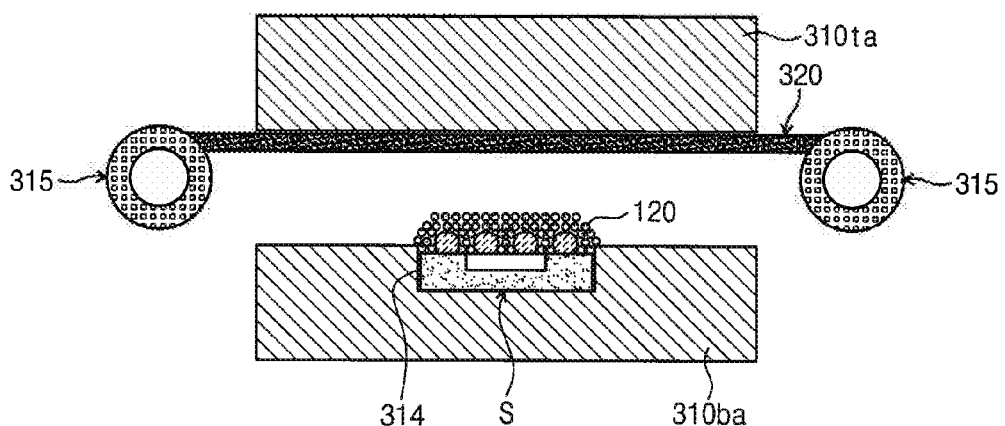
Figure 7C:
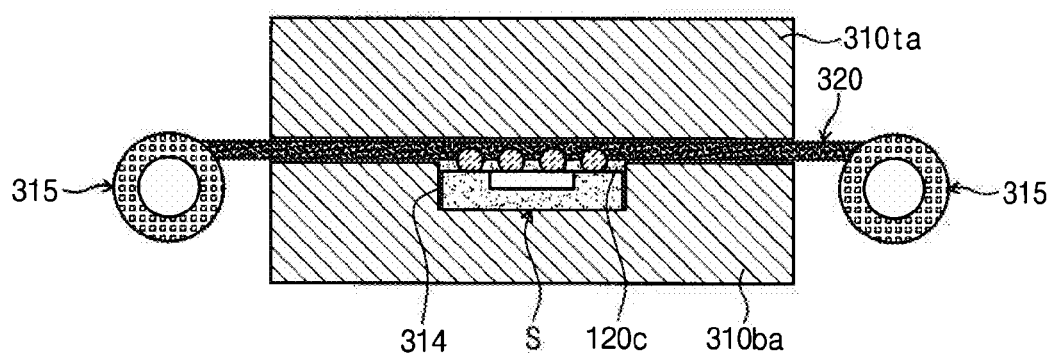

FIGS. 7A to 7C are cross-sectional views illustrating another method of fabricating semiconductor chip package according to embodiment. For brevity, the same parts of description with reference to FIGS. 7A to 7C with that of FIGS. 5A to 5C will be omitted. Referring to FIG. 7A, a mold may include a lower mold 310ba and an upper mold 310ta. The lower mold 310ba may include a molding portion 314, the concave part of the lower mold 310ba. A release tape 320 may be provided between the lower mold 310ba and the upper mold 310ta. The release tape 320 may be supplied to the upper mold 310ta through tape rollers 315 fixed on both sides of the upper mold 310ta.

Referring to FIG. 7B, a group of semiconductor chips S in which bump solder balls are mounted may be loaded on the mounting part 314 of the lower mold 310ba. The group of semiconductor chips S may be loaded so that a rear surface of the semiconductor chip faces the mounting part of the lower mold 310ba. The group of semiconductor chips S may be loaded on the mounting part of the lower mold 310ba by means of an adhesive material layer.

After the release tape 320 is sealed on the upper mold 310ta, a molding material 120 may be injected to the molding part of the lower mold 310ba, so that it covers the bump solder balls of the group of semiconductor chips S loaded on the mounting part of the molding portion 314 of the lower mold 310ba. Accordingly, the molding material 120 may be disposed on the bump solder balls of the semiconductor chips S loaded on the mounting part of the molding portion of the lower mold 310ba.

Referring to FIG. 7C, a molding layer 120c covering the active surface of the semiconductor chip and a molding extension part may be formed by compression molding. The compression molding may include compressing the release tape 320 on the molding material 120 in a liquid state. The compressing may include sealing the upper mold 310ta and the lower mold 310ba together. This compressing may be moving the upper mold 310ta and/or the lower mold 310ba to be in contact with each other with the release tape 320 in between them.

As a result of the compression molding, the molding layer 120c may be formed, the molding layer 120c which exposes portions of each bump solder balls, while covering the active surface of the semiconductor chip and the molding extension part. The molding layer 120c may have concave meniscus surfaces which have edges that contact the bump solder balls, between the bump solder balls disposed adjacent to each other. Accordingly as described above, the active surface of the semiconductor chip may be protected from chemical/physical influence of external environment by means of the molding layer 120c. As the adhesion characteristics of the bump solder balls are enhanced by the molding layer 120c, the thermal stress concentrated on the contact portion and the bump solder balls of the semiconductor chip packages may be dispersed. Accordingly, the solder joint reliability (SJR) of the bump solder balls may be enhanced. Also, the molding layer 120c may decrease a difference in thermal expansion coefficient between the semiconductor chip and a wiring substrate. Thus the SJR of the bump solder balls may be enhanced in a process of mounting the semiconductor chip package on the wiring substrate.

In addition, as the molding layer 120c improves the strength of the group of semiconductor chips S, the molding layer 120c may minimize chipping (breaking of edges of the semiconductor chip package) from occurring during a sequential sawing process of separating into each semiconductor chip package. Therefore, quality deterioration of the semiconductor chip package due to the sawing process may be prevented or reduced.

As the semiconductor chip package fabricated according to the above methods includes a molding layer which has concave meniscus surfaces exposing portions of each of bump solder balls, while covering an active surface of a semiconductor chip and a molding extension part, the active surface of the semiconductor chip may be protected from chemical/physical influences of external environment. Also, the molding layer may decrease the difference in thermal expansion coefficient between the semiconductor chip and a wiring substrate. Thus the solder joint reliability (SJR) of the bump solder balls may be enhanced in a process of mounting the semiconductor chip package on the wiring substrate.

As can be seen in FIGS. 7B and 7C, the molding portion 314 can have a depth that is greater than a thickness of the semiconductor chip S with the molding extension part. When the upper mold 310ta and the lower mold 310ba are brought together, an amount of the molding layer 120c can remain between the semiconductor chip S and molding extension part and the release tape 320.

Figure 8:
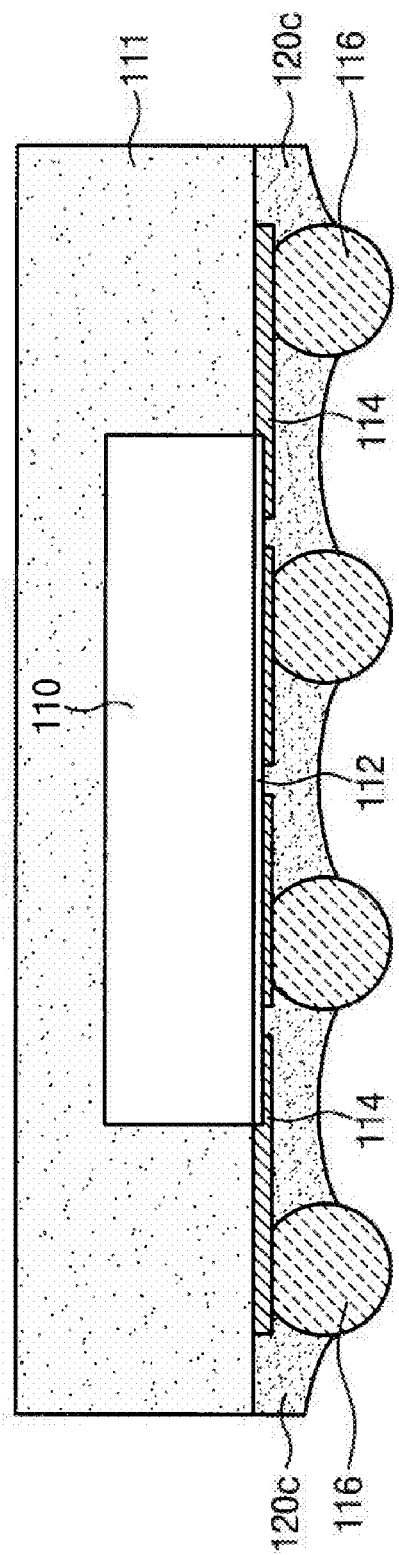
FIG. 8 is a cross-sectional view illustrating an example of a semiconductor chip package according to another embodiment.

FIG. 8 is a cross-sectional view for illustrating another semiconductor chip package according to an embodiment. The parts of description of FIG. 8 which are similar to or same as that of FIG. 1 will be omitted for brevity. Referring to FIG. 8, a semiconductor chip package may include a semiconductor chip 110, a molding extension part 111, redistribution patterns 114, bump solder balls 116 and a molding layer 120c.

An insulation layer 112 can be interposed between the redistribution patterns 114 and an active surface of the semiconductor chip 110. The insulation layer 112 can be used for electrical insulation between the redistribution patterns 114 and the semiconductor chip 110. As the molding extension part 111 is made of an insulation material, for example, including a resin-based material or an epoxy molding compound (EMC), and does not include a conductive pattern, e.g., interconnection on the inside, electrical insulation can, but need not be used between the redistribution patterns 114 and the molding extension part 111. Therefore, in an embodiment, the insulation layer 112 may be interposed only between the active surface of the semiconductor chip 110 and the redistribution patterns 114.

Figure 9:
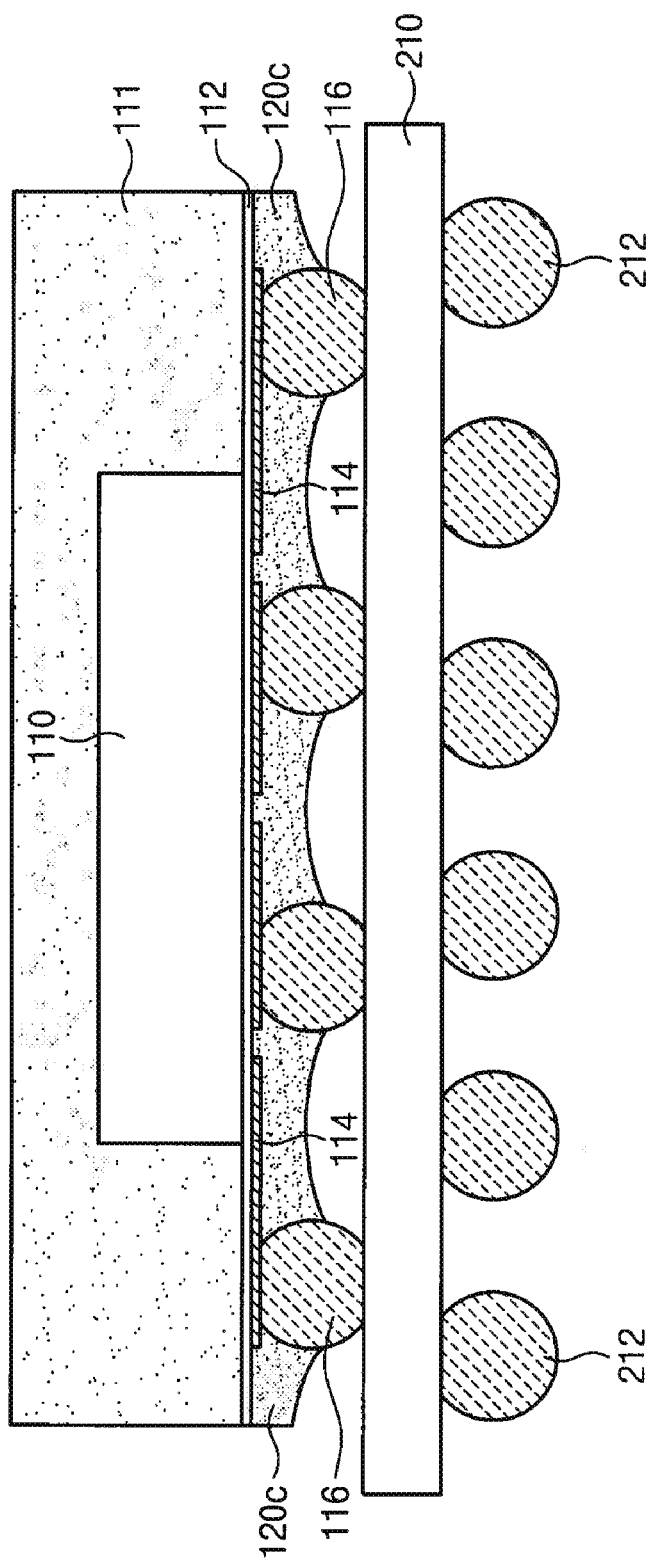
FIG. 9 is a cross-sectional view of an example of a electrical device according to an embodiment.

FIG. 9 is a cross-sectional view for illustrating an electrical device according to an embodiment. Referring to FIG. 9, a semiconductor chip package is prepared, similar to the structure as that in FIG. 1 and/or FIG. 8 fabricated according to the method described with reference to FIG. 3, for example. A wiring substrate 210 is also prepared. An electrical device may be fabricated by mounting the semiconductor chip package on the wiring substrate 210. This will be described taking the electrical device including the semiconductor chip package of FIG. 1 as an example; however, other embodiments can include a variety of semiconductor chip packages as described above.

The semiconductor chip package may include a semiconductor chip 110, a molding extension part 111, redistribution patterns 114, bump solder balls 116, and a molding layer 120c. The molding extension part 111 may surround a rear surface and the sidewalls of the semiconductor chip 110. The redistribution patterns 114 may be extended to the molding extension par 111 while being electrically connected to bonding pads of the semiconductor chip 110. An insulation layer 112 may be further interposed between the redistribution patterns 114, and the active surface of the semiconductor chip 110 and the molding extension part 111. The insulation layer 112 may be for electrical insulation between the redistribution patterns 114 and the semiconductor chip 110. The bump solder balls 116 may be provided on the redistribution patterns 114 of the semiconductor chip 110. The bump solder balls 116 may provide electrical connection between the semiconductor chip 110 and the wiring substrate 210.

The semiconductor chip package according to an embodiment may have a fan-out package structure by including the above semiconductor chip 110, the molding extension part 111, the redistribution patterns 114 and the bump solder balls 116. Thus even though the size of the semiconductor chip 110 becomes smaller, the preexisting solder ball layout may be maintained, therefore, the solder joint reliability (SJR) of the bump solder balls 116 may be prevented from being lowered, during the process of mounting the semiconductor chip package on the wiring substrate 210.

The molding layer 120c may be configured to cover an active surface of the semiconductor chip 110 and the molding extension part 111, while exposing portions of each of the bump solder balls 116. The molding layer 120c may have concave meniscus surfaces which have edges that contact the bump solder balls 116, between the bump solder balls 116 disposed adjacent to each other. The molding layer 120c and bump solder balls 116 may include a cross-section similar to that described above with reference to FIGS. 1 and 2. Accordingly, the active surface of the semiconductor chip 110 may be protected from chemical/physical influence of external environment by means of the molding layer 120c, the adhesion characteristics of the bump solder balls 116 may be enhanced, the solder joint reliability (SJR) may be enhanced, And the molding layer 120c is capable of decreasing a difference in thermal expansion coefficient between the semiconductor chip 110 and the wiring substrate 210. Accordingly, the SJR of the bump solder balls 116 may be enhanced during a process of mounting the semiconductor chip package on the wiring substrate 210.

The wiring substrate 210 may have a top surface on which the semiconductor chip package is mounted, and a bottom surface facing the top surface. The wiring substrate 210 may be a system board including a printed circuit board (PCB). The wiring substrate 210 may have the top surface including bonding electrodes (not shown) and the bottom surface facing the top surface and including connection electrodes (not shown). The bonding electrodes may be electrically connected by corresponding bonding pads of the semiconductor chip 110 and the bump solder balls 116.

A process of forming wiring substrate solder balls 212 on the bottom surface of the wiring substrate 210 may be further included. The wiring substrate solder balls 212 may be provided on connection electrodes which are included on the bottom surface of the wiring substrate 210. The wiring substrate solder balls 212 may be connected to an internal connection (not shown) to provide electrical connection between the semiconductor chip 110 and the external circuit (e.g., main board).

The electrical device having the above structure may include a molding layer which exposes portions of each bump solder balls, while covering an active surface of a semiconductor chip and a molding extension part, therefore, the active surface of the semiconductor chip may be protected from chemical/physical influenced of external environment. Also, a difference in thermal expansion coefficient between the semiconductor chip and a wiring substrate may be decreased during the process of mounting a semiconductor chip package. As the solder joint reliability (SJR) of the bump solder balls is enhanced. As a result, the electrical device may have a stable electrical characteristic. In addition, as the electrical device according to an embodiment includes the molding layer as described above instead of a conventional molding material layer, the fabrication process of the electrical device may be simplified and the fabrication cost may be decreased.

The semiconductor chip package according to an embodiment can include a molding layer having concave meniscus surfaces exposing portions of each of bump solder balls while covering an active surface of a semiconductor chip and a molding extension part. Therefore, the solder joint reliability (SJR) may be enhanced. Also, as the semiconductor chip package includes the molding extension part surrounding a rear surface and sidewalls of the semiconductor chip, and in which redistribution patterns may be extended, preexisting solder ball layout can be applied. Accordingly, semiconductor chip packages capable of enhancing electrical reliability of an electrical device and methods of fabricating the same may be provided. Moreover, a high quality electrical device may be provided.

Although embodiments have been described in connection with the accompanying drawings, embodiments are not limited thereto. It will be apparent to those skilled in the art that various substitution, modifications and changes may be thereto without departing from the scope and spirit of the invention.

What is claimed is:

1. A semiconductor chip package comprising:
a semiconductor chip including a first surface having a plurality of bonding pads, a second surface facing the first surface, and sidewalls;
a molding extension part surrounding the second surface and the sidewalls of the semiconductor chip;
a plurality of redistribution patterns extending from the bonding pads over the molding extension part, and electrically connected to the bonding pads;
a plurality of bump solder balls on the redistribution patterns; and
a molding layer configured to cover the first surface of the semiconductor chip and the molding extension part, while exposing portions of each of the bump solder balls,
wherein the molding layer has concave meniscus surfaces between the bump solder balls adjacent to each other, and
wherein the molding layer has a thermal expansion coefficient below 50 ppm/° C., in a temperature range below a glass transition temperature.

2. The semiconductor chip package as claimed in claim 1, wherein a location of a point of contact between one of the bump solder balls and one of the concave meniscus surfaces is at a height from the first surface that is within about 1/7 a height of the bump solder ball from a height from the first surface on the bump solder ball where the cross-section is a maximum.

3. The semiconductor chip package as claimed in claim 1, wherein:
the concave meniscus surfaces comprise:
a first height from the first surface to portions in contact with the bump solder balls; and
a second height from the first surface to the lowermost part between the bump solder balls; and
a difference in height between the first height and the second height is 1/5 length of the maximum diameter of the bump solder ball.

4. The semiconductor chip package as claimed in claim 1, wherein the concave meniscus surfaces have a matte finish.

5. The semiconductor chip package as claimed in claim 1, wherein the molding extension part is made of the same material with the molding layer.

6. The semiconductor chip package as claimed in claim 1, further comprising:
an insulation layer between the first surface of the semiconductor chip and the redistribution patterns.

7. The semiconductor chip package as claimed in claim 6, wherein the insulation layer is interposed only between the semiconductor chip and the redistribution patterns.

8. An electrical device comprising:
the semiconductor chip package including:
a semiconductor chip including a first surface having a plurality of bonding pads, a second surface facing the first surface, and sidewalls;
a molding extension part surrounding the second surface and the sidewalls of the semiconductor chip;
a plurality of redistribution patterns extending from the bonding pads over the molding extension part, and electrically connected to the bonding pads;
a plurality of bump solder balls on the redistribution patterns; and
a molding layer configured to cover the first surface of the semiconductor chip and the molding extension part, while exposing portions of each of the bump solder balls,
wherein the molding layer has concave meniscus surfaces between the bump solder balls adjacent to each other, and
wherein the molding layer has a thermal expansion coefficient below 50ppm/° C., in a temperature range below a glass transition temperature; and
a wiring substrate in which the semiconductor chip package is mounted on one surface thereof.

9. The electrical device as claimed in claim 8, further comprising:
a plurality of wiring substrate solder balls on a surface facing the one surface of the wiring substrate.

10. A method of fabricating a semiconductor chip package comprising:
preparing a semiconductor chip having a first surface including a plurality of bonding pads, a second surface facing the first surface, and sidewalls;
forming a molding extension part surrounding the second surface and the sidewalls of the semiconductor chip;
forming a plurality of redistribution patterns extending from the bonding pads over the molding extension part, and electrically connected to the bonding pads;
forming a plurality of bump solder balls on the redistribution patterns; and
forming a molding layer configured to cover the first surface of the semiconductor chip and the molding extension part while exposing portions of each of the bump solder balls such that the molding layer has concave meniscus surfaces between the bump solder balls adjacent to each other, wherein the molding layer has a thermal expansion coefficient below 50ppm/° C., in a temperature range below a glass transition temperature.

11. The method as claimed in claim 10, wherein forming the molding extension part comprises:
bonding the first surface of the semiconductor chip to a carrier;
forming the molding extension part to surround the second surface and the sidewalls of the semiconductor chip; and
removing the carrier.

12. The method as claimed in claim 10, further comprising:
forming an insulation layer between the first surface of the semiconductor chip and the molding extension part, and the redistribution patterns.

13. The method as claimed in claim 10, wherein forming the molding layer comprises:
preparing a release tape;
loading the semiconductor chip;
injecting a molding material between the release tape and the semiconductor chip; and
compressing the semiconductor chip and the release tape with each other.

14. The method as claimed in claim 13, further comprising:
preparing the release tape between a lower mold having a molding portion and an upper mold having a loading part;
loading the semiconductor chip on to the loading part;
injecting the molding material into the molding portion; and
sealing the upper mold and the lower mold together.

15. The method as claimed in claim 13, further comprising:
preparing the release tape between a lower mold having a molding portion and an upper mold;
loading the semiconductor chip on the molding portion;
injecting the molding material into the molding portion on the bump solder balls; and
sealing the upper mold and the lower mold together.

16. The method as claimed in claim 13, further comprising preparing the release tape having a thickness larger than a difference between the height of the bump solder balls and a desired height of the molding layer between the bump solder balls.

17. The method as claimed in claim 13, wherein the release tape has a matte finish.

18. The method as claimed in claim 13, further comprising:
preparing a group of a plurality of semiconductor chips including the semiconductor chip;
mounting the group of semiconductor chips on a carrier, the carrier having a chip sawing scribe lanes between the semiconductor chips; and
sawing the chip sawing scribe lanes between the semiconductor chips and the molding layer to separate the group of semiconductor chips into individual semiconductor chip packages.

19. The method as claimed in claim 13, further comprising:
loading the semiconductor chip in a molding portion of a lower mold, the molding portion having a depth greater than a thickness of the semiconductor chip and the molding extension part.

* * * * *